(12) United States Patent
Nereng

(10) Patent No.: US 6,188,131 B1
(45) Date of Patent: Feb. 13, 2001

(54) CLIP FOR RETAINING A HEATSINK ONTO AN ELECTRONIC COMPONENT

(75) Inventor: Timm R. Nereng, Boxboro, MA (US)

(73) Assignee: EMC Corporation, Hopkinton, MA (US)

( * ) Notice: Under 35 U.S.C. 154(b), the term of this patent shall be extended for 0 days.

(21) Appl. No.: 09/009,214

(22) Filed: Jan. 20, 1998

(51) Int. Cl.[7] ................... H05K 7/20; F28F 7/00
(52) U.S. Cl. .............. 257/718; 257/726; 257/727; 257/706; 257/719; 257/707; 361/704; 361/697; 361/687
(58) Field of Search ................... 257/706, 719, 257/718, 726, 727, 712, 675, 793, 713, 70, 722; 361/704, 687, 697

(56) References Cited

U.S. PATENT DOCUMENTS

| | | | |
|---|---|---|---|
| 5,304,735 | * 4/1994 | Earl et al. | 174/16.3 |
| 5,544,013 | * 8/1996 | Chiou | 361/687 |
| 5,581,442 | * 12/1996 | Morosas | 361/704 |
| 5,602,719 | * 2/1997 | Kinion | 257/719 |
| 5,621,244 | * 4/1997 | Lin | 257/718 |
| 5,660,562 | * 8/1997 | Lin | 439/487 |
| 5,678,627 | * 10/1997 | Lee | 165/80.3 |
| 5,740,017 | * 4/1998 | Horng | 257/719 |
| 5,748,446 | * 5/1998 | Feightner et al. | 361/709 |
| 5,771,960 | * 6/1998 | Lin | 257/719 |
| 5,774,335 | * 6/1998 | Pare et al. | 361/704 |
| 5,777,852 | * 7/1998 | Bell | 257/719 |
| 5,784,257 | * 7/1998 | Tata | 257/719 |
| 5,828,551 | * 10/1998 | Hushino et al. | 257/719 |
| 5,847,928 | * 12/1998 | Hinshaw et al. | 361/704 |
| 5,881,800 | * 3/1999 | Chung | 257/727 |
| 5,889,653 | * 3/1999 | Clemens et al. | 361/704 |
| 5,898,571 | * 4/1999 | Mertol | 361/704 |

* cited by examiner

*Primary Examiner*—Alexander Oscar Williams
(74) *Attorney, Agent, or Firm*—Kriegsman & Kriegsman

(57) ABSTRACT

An electronic component assembly includes an electronic component mounted on a socket, a heatsink seated on top of the electronic component for removing at least some of the heat produced by the electronic component during use and a pair of clips for retaining the heatsink in place on top of the electrical component. The heatsink includes a plurality of spaced apart parallel fins. Each clip serves to hold down one end of the heatsink onto the electrical component and comprises an elongated, generally C-shaped member having a base which includes a pair of tabs having holes and a pair of arms, one on each side of the base. Each arm has a hook at its outer end which extends over a fin at one end of the heatsink while the holes on the tabs lockingly engage fingers on one side of the socket.

20 Claims, 5 Drawing Sheets

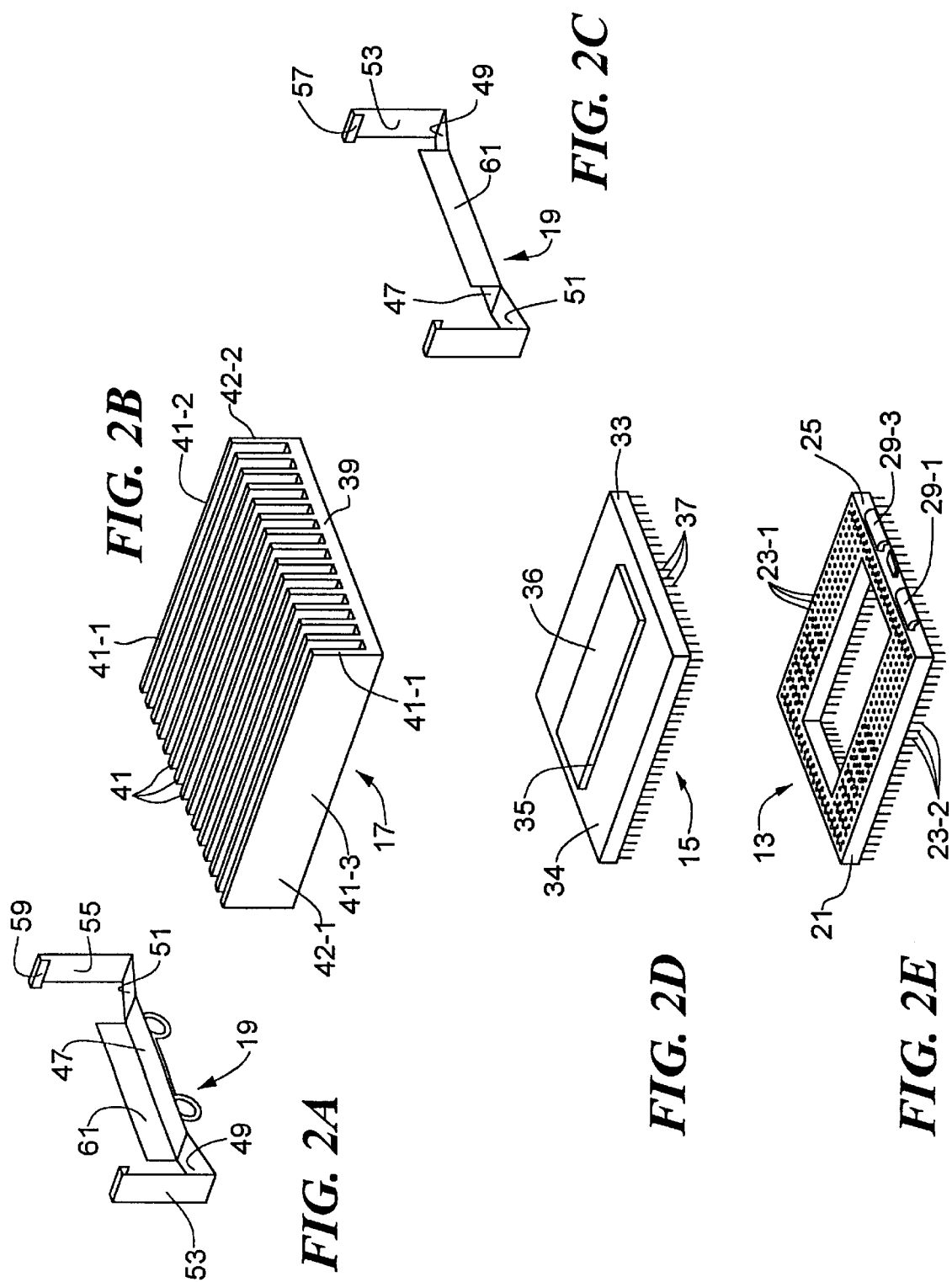

CLIP FOR RETAINING A HEATSINK ONTO AN ELECTRONIC COMPONENT

BACKGROUND OF THE INVENTION

The present invention relates generally to electronic components and, more particularly, to electronic component assemblies which include an electronic component and a heatsink, the heatsink being mounted on the electronic component to remove at least some of the heat produced by the electronic component during use.

Electronic components, such as integrated circuit (IC) chip packages, are well known and commonly used in the art to perform electronic functions. Electronic components are often manufactured in dual-in-line (DIP) leaded packages which can be through-hole or surface mounted onto the circuit board for an electronic system.

In use, electronic components, such as IC chip packages, often produce significant levels of heat which, in turn, can introduce numerous problems. For example, heat produced by an electronic component can potentially cause the electrical component to malfunction.

As a consequence, heatsinks are well known and are commonly used in the art to help remove at least some of the heat produced by electrical components during use. Heatsinks are manufactured of a highly, thermally conductive metal, such as aluminum, and are mounted on a surface of the electrical component to dissipate heat produced by the component during use. The heatsink serves to carry away heat from the electrical component by means of thermal conduction. The heatsink typically comprises a plurality of parallel fins mounted on a base and which serve to facilitate the radiation and convection of the conducted heat. Often a fan or blower will be used to help cool the parallel fins.

Heatsinks are often mounted on the surface of electronic components using a thermally conductive epoxy, such as a silicon compound. However, the use of a thermally conductive epoxy to mount a heatsink onto the surface of an electronic component is a significantly complex manufacturing procedure, which thereby increases the overall cost and complexity of manufacturing. For example, it has been found that there is a considerable level of difficulty in depositing an epoxy layer of uniform thickness between the electronic component and the heatsink. Furthermore, the heatsink and the electronic component must be pressed together with a certain amount of pressure for a certain amount of time in a certain orientation, which further increases the complexity of manufacturing.

Heatsinks have also been mounted on the surface of electronic components using an elongated, generally C-shaped, spring-biased metal clip, the clip having a first end, a second end and a central member between the two ends. Each end is shaped to include a mounting hole. In use, the mounting hole at the first end of the spring biased metal clip is lockably engaged onto a finger at one side of a socket on which the electronic component is mounted. The central member of the spring clip extends longitudinally over the parallel fins and the mounting hole at the second end is lockably engaged to a finger on an opposite side of the socket on which the electronic component is mounted. As such, the central member of the clip applies a downward pressure onto the heatsink, thereby forcing the heatsink down against the electronic component, as desired.

However, it should be noted that the use of a spring-biased metal clip as described above creates a significant drawback. Specifically, the bowed configuration of the spring-biased clip causes a significant portion of the central member of the clip to protrude significantly above the top surface of the heatsink. Because the heatsink is often being used in an electronic system of limited size, the use of spring-biased clips therefore requires the overall size of the electronic system to be increased, which is undesirable.

As a consequence, it is well known in the art to remove one or more of the center fins of a heatsink to enable the spring-biased clip to lie beneath the top surface of the heatsink.

However, the removal of one or more fins of the heatsink decreases the efficiency in which the heatsink functions. Specifically, reducing the number of fins directly limits the amount of heat which is transferred from the electronic component. In addition, the removal of one or more central fins creates a wide channel through the center of the heatsink which, in turn, causes a larger percentage of cool air produced by a fan to pass through the wide center channel instead of the outer fin channels. As a consequence, the outer fins of the heatsink are inadequately cooled, which is undesirable.

SUMMARY OF THE INVENTION

It is an object of this invention to provide a new and improved electronic component assembly.

It is another object of this invention to provide an electronic component assembly which comprises an electronic component, a heatsink seated on the electronic component to remove at least some heat produced the electronic component during use and an arrangement for holding the heatsink in place on the electronic component, the heatsink including a plurality of fins.

It is yet another object of this invention to provide an electronic component assembly as described above in which the arrangement for holding the heatsink on the electronic component does not involve removing any of the fins on the heatsink.

It is still another object of this invention to provide an electronic component assembly as described above in which the arrangement for holding the heatsink on the electronic component does not significantly increase the overall size of the electronic component assembly.

It is a further object of this invention to provide a new and improved method for holding a heatsink onto an electrical component mounted on a socket.

Accordingly, there is provided an electronic component assembly comprising a socket having a pair of opposite sides, each opposite side having a finger, an electronic component mounted on said socket, a heatsink seated on said electronic component for removing at least some of the heat produced by the electronic component during use, said heatsink having a first end, a second end and a plurality of fins closely spaced in parallel relation, the plurality of fins comprising a first end fin having an exterior surface and a second end fin having an exterior surface, and a pair of clips for retaining said heatsink onto said electronic component, one clip being disposed on each side of the heatsink, each clip comprising an elongated member including a tab having an opening through which a first finger of said socket projects into, a first arm which is laterally disposed against the exterior surface of the first end fin, a second arm which is laterally disposed against the exterior surface of the second end fin, a hook formed on the first arm which is sized and shaped to engage the first end fin on said heatsink, and a hook formed on the second arm which is sized and shaped to engage the second end fin on said heatsink.

Various other features and advantages will appear from the description to follow. In the description, reference is made to the accompanying drawings which form a part thereof, and in which is shown by way of illustration, specific embodiments for practicing the invention. These embodiments will be described in sufficient detail to enable those skilled in the art to practice the invention, and it is to be understood that other embodiments may be utilized and that structural changes may be made without departing from the scope of the invention. The following detailed description is therefore, not to be taken in a limiting sense, and the scope of the present invention is best defined by the appended claims.

BRIEF DESCRIPTION OF THE DRAWINGS

A fuller understanding of the nature and objects of the present invention will become apparent upon consideration of the following detailed description taken in connection with the accompanying drawings, wherein like reference numerals represent like parts and wherein:

FIG. 2A is a perspective view of one of the clips shown in FIG. 1;

FIG. 2B is a perspective view of the heatsink shown in FIG. 1;

FIG. 2C is a perspective view of the other clip shown in FIG. 1;

FIG. 2D is a perspective view of the electronic component shown in FIG. 1;

FIG. 2E is a perspective view of the socket shown in FIG. 1;

DETAILED DESCRIPTION OF THE PREFERRED EMBODIMENT

Figure 3:
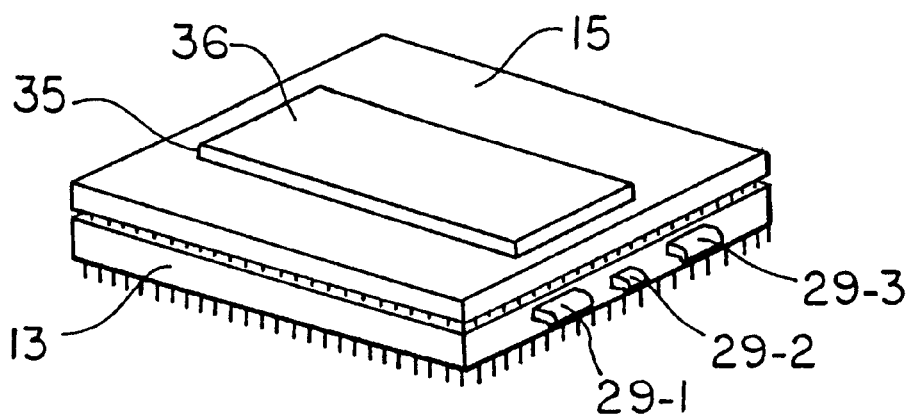
FIG. 3 is a perspective view of the electronic component and the socket in the electronic component assembly shown in FIG. 1, the electronic component being shown mounted on the socket.
Figure 1:
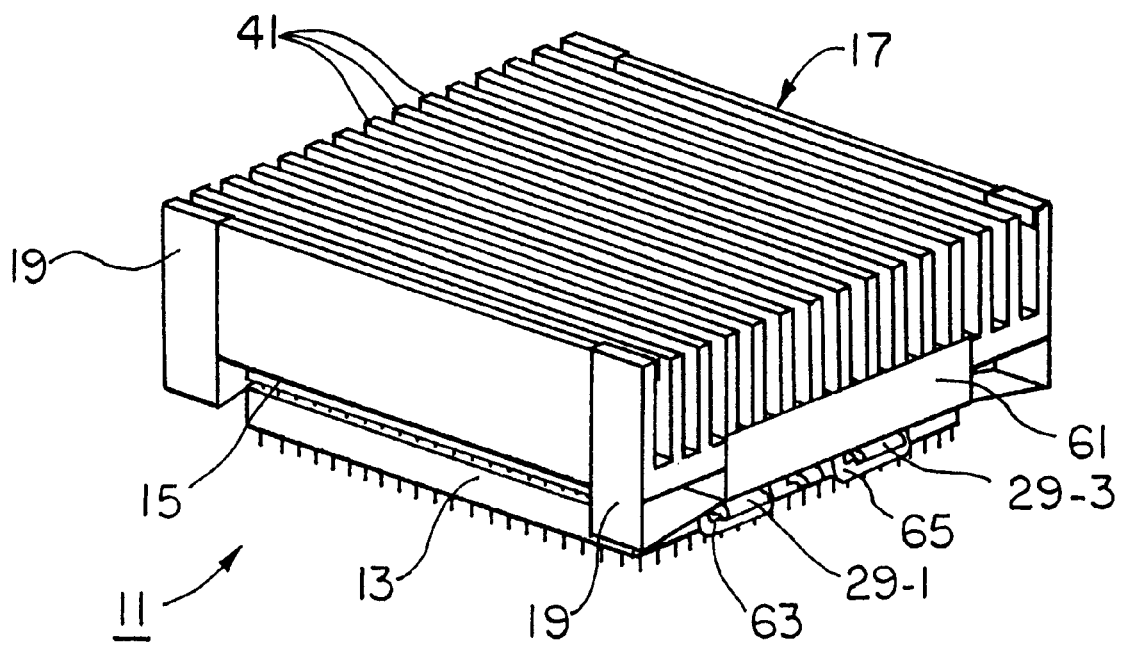
FIG. 1 is a perspective view of an electronic component assembly constructed according to the teachings of the present invention.
Figure 4:
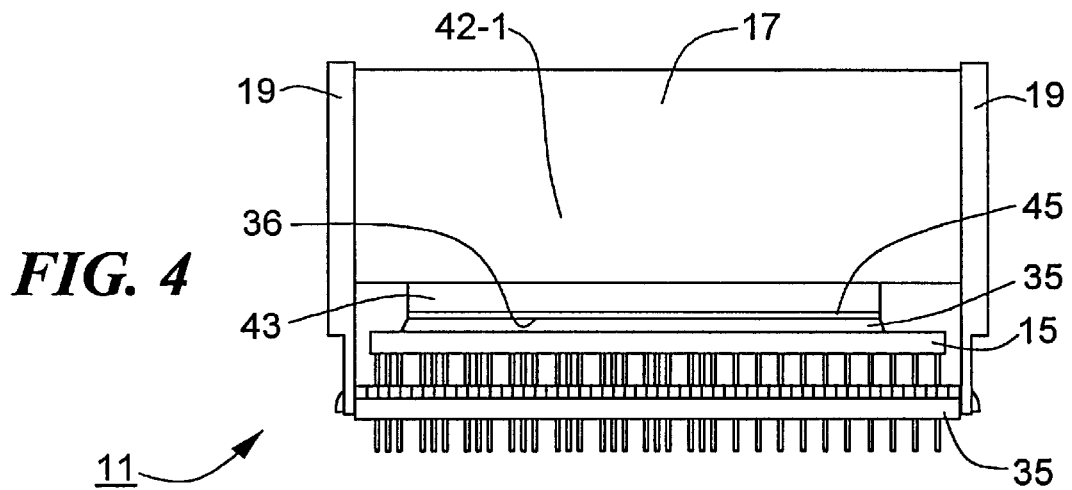
FIG. 4 is a front view of the electronic component assembly shown in FIG. 1.

Referring now to the drawings, there is shown in FIG. 1 an electronic component assembly constructed according to the teachings of the present invention, the electronic component assembly being identified generally by reference numeral 11.

Electronic component assembly 11 comprises a socket 13, an electronic component 15 mounted on socket 13, a heatsink 17 mounted on electronic component 15, and a pair of clips 19 for retaining heatsink 17 onto electronic component 15.

Figure 5A:
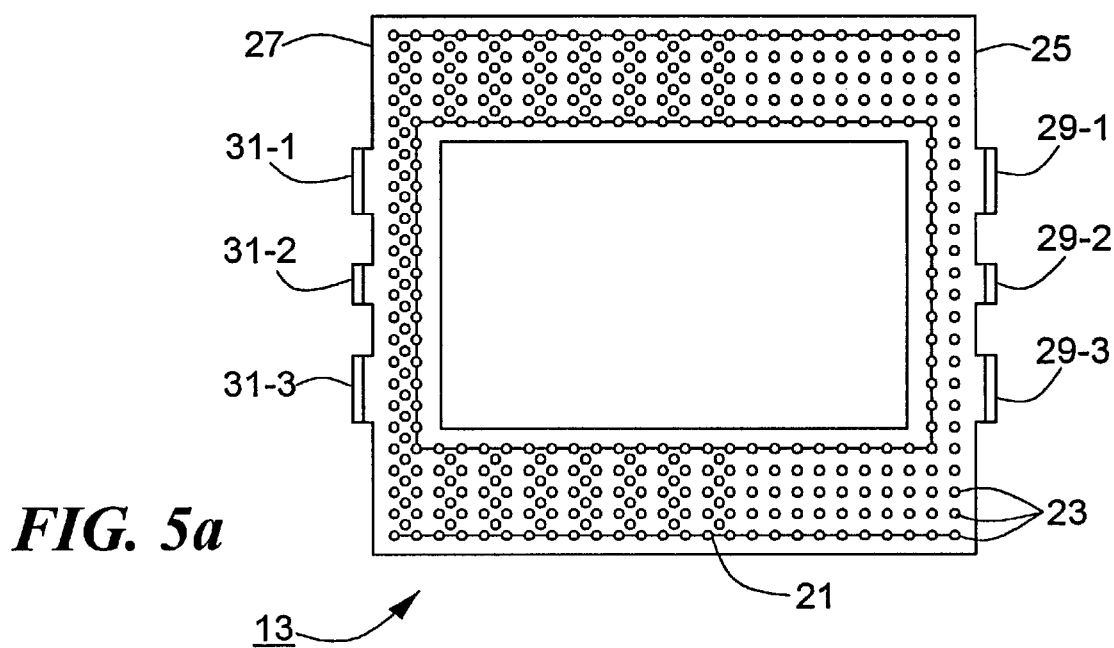
FIG. 5a is a bottom plan view of the socket shown in the assembly in FIG. 1.
Figure 5B:
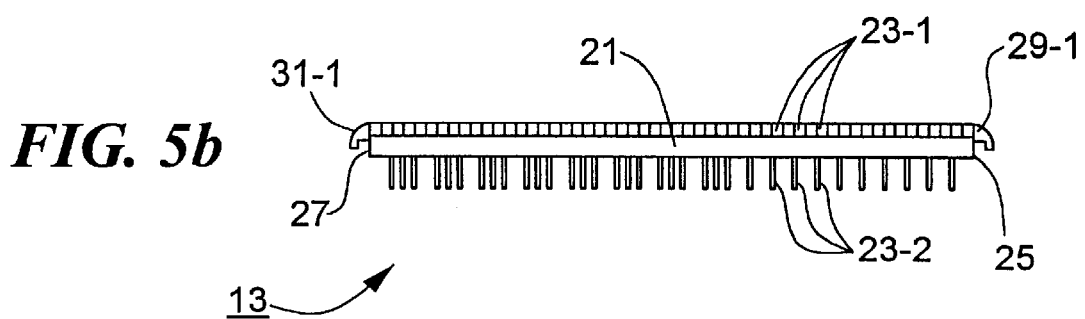
FIG. 5b is a front view of the socket shown in the assembly in FIG. 1.

Socket 13, which is also shown in FIGS. 5a and 5b, represents any electronic socket which includes a plurality of fingers, as will be described in detail below. Preferably, socket 13 is a Series PT Interstitial PGA socket manufactured by Aries Electronics, Inc. of Frenchtown, N.J. and can be mounted onto a standard printed circuit board. As can be seen, socket 13 comprises an open frame plastic insulator 21 and a plurality of low insertion force contacts 23 which extend through insulator 21. Insulator 21 is generally rectangular in shape and includes a first side 25 and a second side 27, side 27 being opposite side 25. First side 25 includes a plurality of integrally formed, downwardly curved, rigid fingers 29-1, 29-2 and 29-3, respectively. Similarly, second side 27 includes a plurality of integrally formed, downwardly curved, rigid fingers 31-1, 31-2 and 31-3, respectively. Each of low insertion force contacts 23 is shaped to include a contact receptacle 23-1 into which the contact of an electronic component can be disposed with a low insertion force and a contact pin 23-2 which can be thru-hole mounted onto a printed circuit board.

Figure 6A:
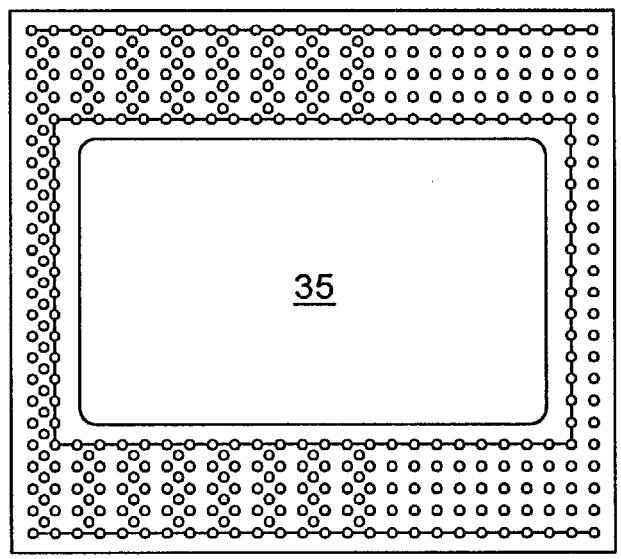
FIG. 6a is a bottom plan view of the electronic component shown in the assembly in FIG. 1.
Figure 6B:
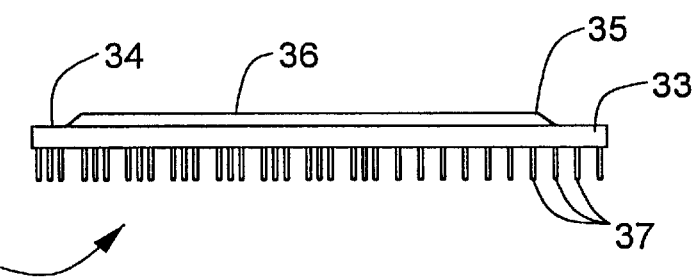
FIG. 6b is a front view of the electronic component shown in the assembly in FIG. 1.

Electronic component 15, which is also shown in FIGS. 6a and 6b, is any electronic component which can be mounted onto socket 13 and may be, for example, a processor such as the Pentium Pro processor manufactured by Intel Corporation of Santa Clara, Calif. Electronic component 15 comprises a base 33, an integrated circuit (IC) chip package 35 disposed in base 33 and a plurality of contacts 37 which protrude out from base 33. IC chip package 35 is disposed in base 33 so that a top surface 36 of package 35 protrudes slightly above a top surface 34 of base 33.

Plurality of contacts 37 are in electrical connection with IC chip package 35 and are configured on component 15 in the identical pattern in which contacts 23 are configured on socket 13. As a result, electronic component 15 can be mounted onto socket 13 with one contact 37 of component 15 extending into a corresponding receptacle 23-1 in socket 13 so as to electrically connect component 15 to socket 13. As noted above, contacts 23 of socket 13 are low insertion force contacts which thereby facilitates the ease in which electronic component 15 can be removably mounted onto socket 13.

It should be noted that although electronic component assembly 11 is shown comprising an electronic component 15 mounted on a socket 13 having fingers 29 and 31, it is to be understood that electronic component assembly 11 could alternatively comprise an electronic component having integrally formed fingers on electronic component 15 rather than socket 13, without departing from the spirit of the present invention.

Figure 7:
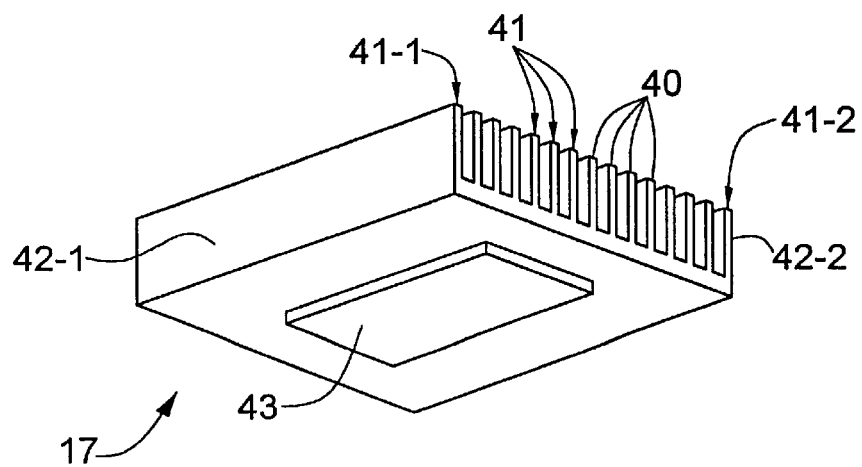
FIG. 7 is a perspective view taken from the bottom of the heatsink shown in the assembly in FIG. 1.

Heatsink 17, which is also shown in FIG. 7, is mounted on electronic component 15 and serves to remove excess heat produced by electronic component 15, and more particularly IC chip package 35, during use. Heatsink 17 is constructed of a highly conductive metal, such as aluminum, and comprises a generally rectangular base 39 and a plurality of thin, elongated fins 41 which are integrally formed onto base 39, each fin 41 comprising a free end 40. Plurality of fins 41 are closely spaced in parallel relation and project out from base 39. Plurality of fins 41 include a first end fin 41-1 at one end 41-3 of heatsink 17 and a second end fin 41-2 at the other end 41-4 of heatsink 17, end fins 41-1 and 41-2 defining the width of heatsink 17. First end fin 41-1 includes an exterior surface 42-1 and second end fin 41-2 includes an exterior surface 42-2.

Heatsink 17 further comprises a platform 43 affixed to base 39, such as by solder, platform 43 and fins 41 being disposed on opposite sides of base 39. Platform 43 is sized and shaped to match the dimensions of top surface 36 of IC chip package 35. As such, with heatsink 17 is mounted on electronic component 15, platform 43 is disposed directly on top surface 36 of package 35. As shown in FIG. 2, a thin layer of a thermally conductive material 45, such as a grease sealant or a heat conductive pad, may be disposed between platform 43 and package 35 to maximize the quality of contact, and consequently the heat transfer, between electronic component 15 and heatsink 17. However, it is to be understood that thermally conductive material 45 could be removed from assembly 11 without departing from the spirit of the present invention.

Pair of clips 19 serve to retain heatsink 17 onto electronic component 15. Clip 19 is unitary in construction and is manufactured using a strong and resilient material, such as spring steel.

Clip 19 comprises an elongated, generally C-shaped member having an inner base section 47 and a pair of outer base sections 49 and 51 disposed on opposite ends of inner base section 47. Inner base section 47 and outer base sections 49 and 51 together form a springed base 52 which is naturally biased in a bowed configuration but which can be flexed into a substantially linear configuration.

Clip 19 further comprises a pair of elongated arms 53 and 55 which extend up from the free ends of outer base sections 49 and 51, respectively. A pair of hooks 57 and 59 are formed on the free end of arms 53 and 55, respectively. Although arms 53 and 55 and hooks 57 and 59 are shown as having a uniform width, it is to be understood that arms 53 and 55 and/or hooks 57 and 59 could taper out in width to improve the strength of clip 19 without departing from the spirit of the present invention.

Figure 8:
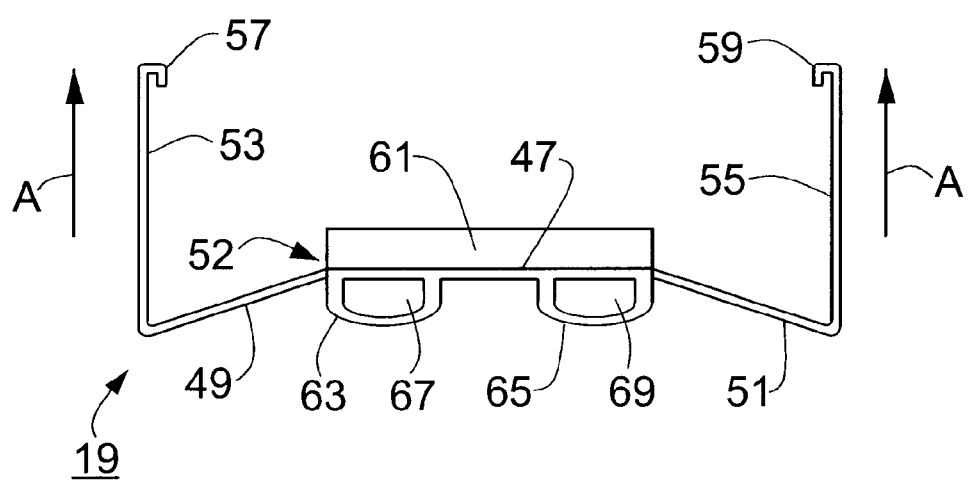
FIG. 8 is a right side view of one of the clips shown in the assembly in FIG. 1.

It should be noted that, with inner base section 47 held fixed, the compression of inner base section 47 and outer base sections 49 and 51 into a substantially linear configuration serves to move arms 53 and 55 in an upward direction (as denoted by arrows A in FIG. 8). Upon the release of the compressive force, inner base section 47 and outer base sections 49 and 51 return to its bowed configuration which serves to move arms 53 and 55 back down to its original position (in the opposite direction of arrows A). An upwardly extending flange 61 and a pair of downwardly extending tabs 63 and 65 are disposed on opposite sides of inner base section 47, downwardly extending tab 63 having an opening 67 and downwardly extending tab 65 having an opening 69.

With heatsink 17 seated mounted on electronic component 15 and, in addition, electronic component 15 mounted on socket 13, clips 19 serve to retain heatsink 17 onto electronic component 15 in the following manner. One clip 19 is positioned so that fingers 29-1 and 29-3 protrude through openings 69 and 67, respectively, and so that flange 61 abuts heatsink 17. Fingers 29-1 and 29-3 on socket 13 engage tabs 65 and 63 on clip 19, respectively, to hold inner base section 47 in a fixed position.

Positioned as such, arm 53 protrudes up from outer base section 49 and abuts against exterior surface 42-2 of end fin 41-2. Similarly, arm 55 protrudes up from outer base section 51 and abuts against exterior surface 42-1 of end fin 41-1. Inner base section 47 and outer base sections 49 and 51 are then compressed into a substantially linear configuration. This causes arms 53 and 55 to move in an upward direction and, in turn, causes hooks 57 and 59, respectively, to project up and laterally across the free ends 40 of end fins 41-2 and 41-1, respectively. Upon the release of the compressive force, inner base section 47 and outer base sections 49 and 51 return to its bowed configuration. This causes arms 53 and 55 to move back down to its original position which, in turn, causes hooks 57 and 59 to move down and engage the free end 40 of end fins 41-2 and 41-1. The downward movement of hooks 57 and 59 pulls heatsink 17 tightly against electronic component 15.

The other clip 19 is positioned on the opposite side of heatsink 17 in a similar manner so that fingers 31-1 and 31-3 engage tabs 63 and 65, respectively. Together, pairs of clips 19 pull heatsink 17 down tightly against electronic component 15 to maximize the level of heat transfer therebetween. Due to the abutment of arms 53 and 55 against end fins 41-1 and 41-2, as well as the abutment of flange 61 against heatsink 17, clips 19 serve to preclude any longitudinal or lateral movement of heatsink 17 relative to electronic component 15.

It should be noted that although only one specific configuration has been disclosed for retaining a heatsink onto an electrical component mounted on a socket using two retaining clips, one at each end of the heatsink, other configurations using two retaining clips, one at each end of the heatsink, to retain the integrity of the heatsink fins, rather than using one retaining clip which extends over the central portion of the heatsink, are possible and conceivable and within the scope of the this invention.

The embodiment shown in the present invention is intended to be merely exemplary and those skilled in the art shall be able to make numerous variations and modifications to it without departing from the spirit of the present invention. All such variations and modifications are intended to be within the present invention as defined in the appended claims.

What is claimed is:

1. An electronic component assembly comprising:
   (a). a socket having a first side and a second side, the first side having a first finger,
   (b). an electronic component mounted on said socket,
   (c). a heatsink seated on said electronic component for removing at least some of the heat produced by the electronic component during use, said heatsink having a plurality of fins closely spaced in parallel relation, the plurality of fins comprising a first end fin having an exterior surface and a second end fin having an exterior surface, and
   (d). a first clip for retaining said heatsink onto said electronic component, said first clip comprising,
      (i). a base
      (ii). a tab formed on said base, said tab having an opening which is sized and shaped to receive the first finger of the socket,
      (iii). a first arm at one end of the base, the first arm being laterally disposed against the exterior surface of the first end fin,
      (iv). a second arm at the other end of the base, the second arm being laterally disposed against the exterior surface of the second end fin,
      (v). a first hook formed on the first arm said first hook being sized and shaped to engage the free end of one fin on said heatsink, and
      (vi). a second hook formed on the second arm, said second hook being sized and shaped to engage the free end of another fin on said heatsink.

2. The electronic component assembly as claimed in claim 1 wherein said first clip is spring-biased so as to urge said heatsink against said electronic component.

3. The electronic component assembly as claimed in claim 2 wherein the hook formed on the first arm engages the first end fin and the hook formed on the second arm engages the second end fin.

4. The electronic component assembly as claimed in claim 3 wherein said first clip further includes a flange formed on the base which is adapted to abut against said heatsink.

5. The electronic component assembly as claimed in claim 4 wherein the socket comprises a second finger.

6. The electronic component assembly as claimed in claim 5 wherein said first clip further comprises a second tab formed on said base, said second tab having an opening which is sized and shaped to receive the second finger on said socket.

7. The electronic component assembly as claimed in claim 6 wherein said first clip is constructed of spring steel.

8. The electronic component assembly as claimed in claim 7 wherein the socket includes a third finger.

9. The electronic component assembly as claimed in claim 1 further comprising a second clip, said second clip comprising,
   (a). a base,
   (b). a tab formed on said base, said tab having an opening which is sized and shaped to receive the third finger of the socket,
   (c). a first arm at one end of the base, the first arm being adapted to be laterally disposed against the exterior surface of the first end fin,
   (d). a second arm at the other end of the base, the second arm being adapted to be laterally disposed against the exterior surface of the second end fin,
   (e). a first hook formed on the first arm. said first hook being sized and shaped to engage the free end of a fin on said heatsink, and
   (f). a second hook formed on the second arm, said second hook being sized and shaped to engage the free end of another fin on said heatsink.

10. A clip for retaining a heatsink onto an electronic component mounted on a socket, the heatsink having a plurality of fins closely spaced in parallel relation, each of the plurality of fins having a free end, the plurality of fins comprising a first end fin having an exterior surface and a second end fin having an exterior surface, the socket having a first finger, said clip comprising:
    (a). a base,
    (b). a tab formed on said base, said tab having an opening which is sized and shaped to receive the first finger of the socket,
    (c). a first arm at one end of the base, the first arm being adapted to be laterally disposed against the exterior surface of the first end fin,
    (d). a second arm at the other end of the base, the second arm being adapted to be laterally disposed against the exterior surface of the second end fin,
    (e). a first hook formed on the first arm, said first hook being sized and shaped to engage the free end of one fin on said heatsink, and
    (f). a second hook formed on the second arm, said second hook being sized and shaped to engage the free end of another fin on said heatsink.

11. The clip as claimed in claim 10 wherein said clip is spring-biased so as to urge said heatsink against said electronic component.

12. The clip as claimed in claim 11 wherein the hook formed on the first arm is adapted to engage the first end fin and the hook formed on the second arm is adapted to engage the second end fin.

13. The clip as claimed in claim 12 wherein said clip further includes a flange formed on the base which is adapted to abut against said heartsink.

14. The clip as claimed in claim 13 wherein said socket further comprises a second finger.

15. The clip as claimed in claim 14 wherein said clip further comprises a second tab formed on said base, said second tab having an opening which is sized and shaped to receive the second finger.

16. The clip as claimed in claim 15 wherein said clip is constructed of spring steel.

17. An electronic component assembly comprising:
    (a). a socket having a pair of opposite sides and a finger on each side,
    (b). an electronic component mounted on said socket,
    (c). a heatsink seated on said electronic component, said heatsink having a plurality of parallel fins, the plurality of fins comprising a first end fin, a second end fin and a plurality of fins between the two end fins, and
    (d). a pair of clips for retaining said heatsink onto said electronic component, each clip comprising a base and a pair of arms, one arm being on each side of the base, said base having a tab having an opening through which the finger extends into, and a hook on the end of each of the arms, each hook engaging a different one of said end fins on said heatsink for holding said heatsink down on said electrical component.

18. An electronic component assembly comprising:
    (a). a socket, (b). an electronic component mounted on said socket,
    (c). a heatsink seated on said electronic component, said heatsink having a pair of ends,
    (d). means for clipping one end of said heatsink onto one of said socket and electrical component, and
    (e). means for clipping the other end of said heatsink onto one of said socket and electrical component.

19. The electronic component assembly of claim 18, wherein said means comprises a pair of clips.

20. The clip as claimed in claim 10 wherein said elongated member is generally C-shaped.

* * * * *